| (12) | United States Patent | (10) Patent No.: | US 8,549,218 B2 |
|---|---|---|---|
| | Fusella et al. | (45) Date of Patent: | Oct. 1, 2013 |

(54) LOW COST IMPLEMENTATION FOR SMALL CONTENT-ADDRESSABLE MEMORIES

(75) Inventors: Yves Fusella, Aubagne (FR); Stephane Godzinski, Peynier (FR)

(73) Assignee: Inside Secure, Aix-en-Provence, Cedex (FR)

( * ) Notice: Subject to any disclaimer, the term of this patent is extended or adjusted under 35 U.S.C. 154(b) by 713 days.

(21) Appl. No.: 12/268,367

(22) Filed: Nov. 10, 2008

(65) Prior Publication Data

US 2010/0122025 A1 May 13, 2010

(51) Int. Cl.
*G06F 12/00* (2006.01)

(52) U.S. Cl.
USPC .......... 711/108; 711/103; 711/220; 365/49.1; 365/49.17

(58) Field of Classification Search
None
See application file for complete search history.

(56) References Cited

U.S. PATENT DOCUMENTS

| 5,485,418 | A | 1/1996 | Hiraki et al. | |
|---|---|---|---|---|
| 5,604,879 | A | 2/1997 | Beavers et al. | |
| 5,627,987 | A * | 5/1997 | Nozue et al. | 711/200 |
| 5,933,852 | A * | 8/1999 | Jeddeloh | 711/153 |
| 6,000,006 | A | 12/1999 | Bruce et al. | |
| 7,013,376 | B2 * | 3/2006 | Hooper, III | 711/202 |
| 2007/0143569 | A1 * | 6/2007 | Sanders et al. | 711/203 |

* cited by examiner

*Primary Examiner* — Matthew Bradley
*Assistant Examiner* — Alan Otto
(74) *Attorney, Agent, or Firm* — Panitch Schwarze Belisario & Nadel LLP

(57) ABSTRACT

A content-addressable memory (CAM) for managing the reallocation of erasable objects within a non-volatile memory is conceptually separated into two tables: a first table provides verification of whether or not a logical address has been reallocated and, if so, a second table provides the physical address of the reallocated erasable object.

10 Claims, 3 Drawing Sheets

LOW COST IMPLEMENTATION FOR SMALL CONTENT-ADDRESSABLE MEMORIES

TECHNICAL FIELD

This subject matter is generally related to content-addressable memory.

BACKGROUND

Using standard computer memory, an address is supplied to retrieve the contents stored at that memory address. Content-addressable memory (CAM), instead, receives data indicative of memory contents and searches the entire memory to locate one or more addressable locations in which that data can be found. The CAM can then return one or more addresses which contain the requested data.

Typical uses for CAMs include routing information lookup, cache controllers, database engines, and translation look aside buffers (TLB). A TLB can be used in the computer memory management of a virtual memory system to translate a virtual address into a physical address location.

Using some memory technologies, such as FLASH memory, individual storage locations (e.g., blocks, pages, etc.) can become worn out from repeated erasures. A TLB can be used to track the present location of data which has been reallocated from a failed memory location to a new memory location.

SUMMARY

A CAM is described which can be used to manage the reallocation of erasable objects within a non-volatile memory without exacting a performance degradation unless the erasable object has been reallocated to a new memory location. The CAM is conceptually separated into two tables: a first table provides verification of whether or not a logical address has been reallocated and, if so, a second table provides the physical address of the reallocated erasable object.

DETAILED DESCRIPTION

Example Embedded Non-Volatile Memory Implementation

Figure 1:
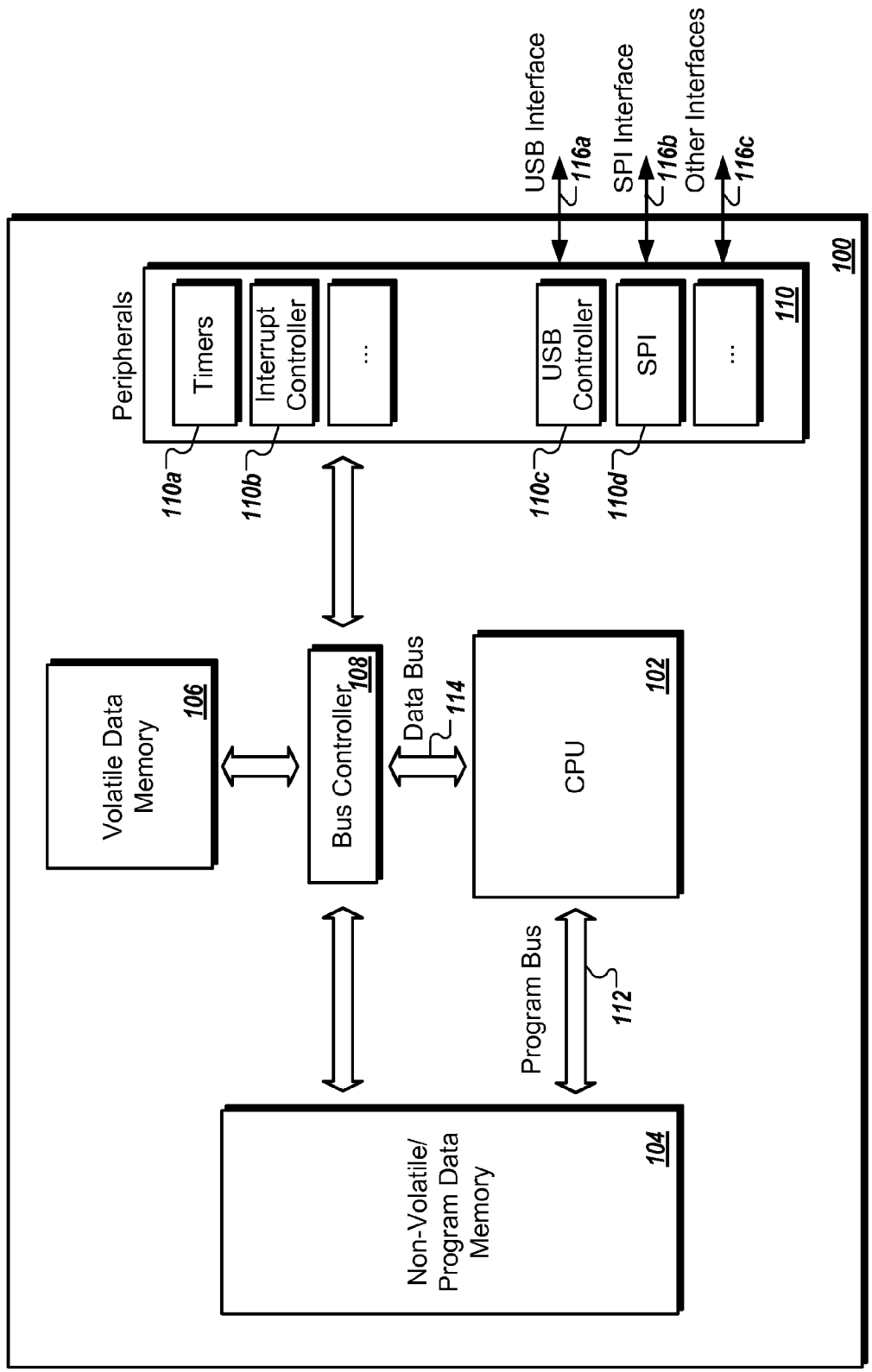
FIG. 1 is a block diagram of an example microcontroller with an embedded non-volatile memory.

FIG. 1 is a block diagram of an example microcontroller 100 with an embedded non-volatile memory 104. The microcontroller 100 can be used within an electronic device such as, for example, a handheld computing device (e.g., mobile telephone, personal data assistant, etc.), secure identification card (e.g., banking card, building access badge, etc.), or small consumer appliance (e.g., kitchen appliance, power tool, electronic toy, media player, etc.). In some implementations, the microcontroller 100 can be used for the storage and sharing of secure data (e.g., a USB drive).

The microcontroller 100 can include a central processing unit (CPU) 102 which executes program instructions stored in non-volatile memory 104 (e.g., Flash), and communicates with volatile data memory 106 (e.g., SRAM) and one or more peripheral devices 110 such as, for example, one or more timers 110a, an interrupt controller 110b, a Universal Serial Bus (USB) controller 110c, a system packet interface (SPI) 110d or any other interface.

The CPU 102 receives the program instructions over a program bus 112 and transfers data across a data bus 114. A bus controller 108 controls data traffic between the CPU 102, the non-volatile memory 104, the volatile data memory 106, and the peripheral devices 110. One or more peripheral devices 110 can couple to external devices through one or more interfaces 116 (e.g., a USB interface 116a, an SPI interface 116b, and/or an other interface 116c). The interfaces 116, for example, can include circuitry for implementing wired and/or wireless data connections.

The microcontroller 110 can include more, fewer, or different elements than illustrated within FIG. 1. For example shown, the non-volatile memory 104 can be implemented using two logically and/or physically separate embedded memories which may include two different non-volatile memory technologies. The separate embedded memories, for example, can be used to store different types of information (e.g., program code, data).

Example Small CAM Implementation

Figure 2:
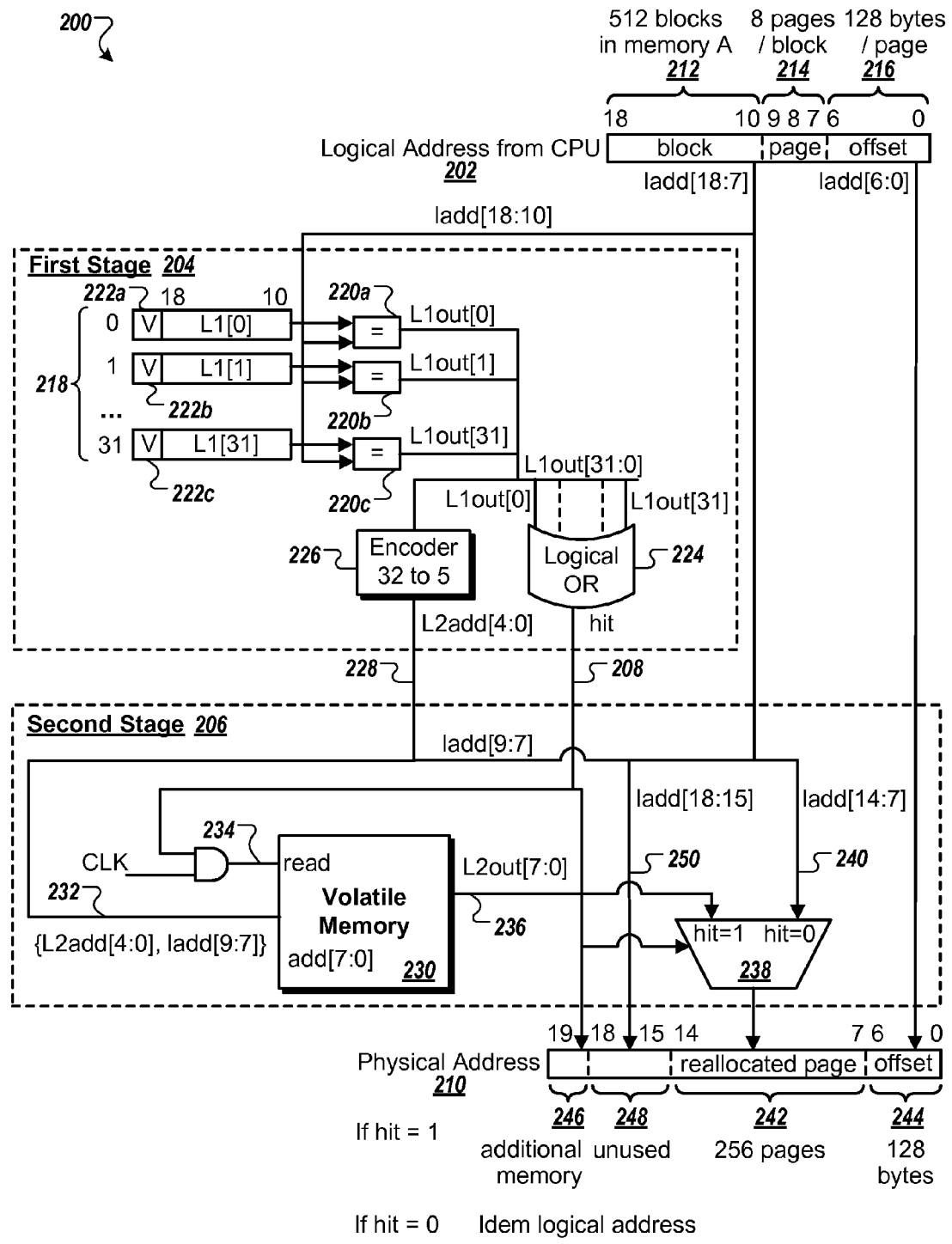
FIG. 2 is a conceptual diagram of an example small CAM for managing non-volatile memory.

FIG. 2 illustrates a conceptual diagram of an example small CAM 200 for managing non-volatile memory. The CAM 200, for example, could be implemented within the volatile data memory 106 of the microcontroller 100 (as described in FIG. 1). The CAM can be used to translate incoming addresses from the CPU 102 which have been reallocated to a different memory location. In some implementations, an erasable object (e.g., block, page, etc.) within a non-volatile memory (e.g., the non-volatile program data memory 104) can be reallocated due to physical failure of the memory location (e.g., the number of erases to the memory block has reached the endurance limit of the non-volatile memory technology).

The CAM 200 receives a logical address 202 from the CPU (e.g., CPU 102). Using the contents of the logical address 202, the CAM 200 uses a first stage 204 to verify that the erasable object has been reallocated and then a second stage 206 to look up the new address location. In this manner, if the memory contents of the logical address 202 have not been reallocated, in some implementations, there will be no timing penalty involved in using the CAM 200. For example, if the total possible number of reallocated memory locations is relatively small, the first stage 204 can implement a look up verification within a single clock cycle. In this manner, the two-stage lookup mechanism of the CAM 200 is beneficial for memories in which a small percentage of the total memory locations are reallocated and/or memories which contain a small total number of memory locations.

If the first stage 204 generates a positive value within a hit output 208 (e.g., an entry containing the logical address 202 has been located), the second stage 206 generates a physical address 210 representing the reallocated location of the erasable object originally residing at the logical address 202. If the first stage 204 does not generate a positive value for the hit output 208, the physical address 210 receives a copy of the logical address 202.

In the example of the CAM 200, a main non-volatile memory segment contains 512K bytes of memory separated into 512 blocks of memory, each block of memory containing eight 128-byte memory pages. Up to 256 pages (e.g., 32K bytes of memory or 32 blocks) of the main non-volatile memory segment can be reallocated to a 32K non-user-addressable non-volatile memory segment. In some implementations, the main non-volatile memory segment and the non-user-addressable non-volatile memory segment are both logical partitions of a single non-volatile memory (e.g., the non-volatile program data memory 104 as shown in FIG. 1).

The logical address 202 can be separated into a block address section 212, a page address section 214, and an offset address section 216. Address space, in the example of the CAM 200, is reallocated at the block level (e.g., the erasable object is a block of non-volatile memory). As such, the block address section 212, containing the upper nine bits of the logical address 202, can be used by the first stage 204 to verify whether or not the block has been reallocated.

The first stage 204 receives the block address section 212 of the logical address 202. Within the first stage 204, a set of thirty-two lines 218 can each contain the block address section of a reallocated logical address. Each of the thirty-two lines 218 is connected to a comparator 220. Using the comparators 220, each of the thirty-two lines 218 can be compared to the block address section 212 of the logical address 202 in parallel. In some implementations, each of the thirty-two-lines 218 includes an additional verification bit 222. The verification bit 222, for example, can be set when one of the thirty-two lines 218 is populated with the block address section of the logical address of a reallocated block of memory. The first stage 204 can use the verification bit 222, in some implementations, to select which of the thirty-two lines 218 to compare to the block address section 212 of the logical address 202.

The outputs of the comparators 220 are fed into a logical OR gate 224. If any one of the comparators output a value of true, the logical OR gate 224 can assert a positive value for the hit output 208. The hit output 208 is fed into the second stage 206.

The outputs of the comparators 220 are also fed into a thirty-two to five-bit encoder 226. The encoder 226 outputs the line number (e.g., zero through thirty-one) of the line 218 which contains the matching block address section. A bus containing a five-bit line number 228 is connected from the output of the encoder 226 to the second stage 206.

The second stage 206 receives the five-bit line number 228, the hit output 208, the block address section 212 of the logical address 202 and the page address section 214 of the logical address 202. The second stage 206 contains a volatile translation memory 230, sized appropriately to store the addresses of the maximum number of pages which can be reallocated (e.g., 32 blocks*8 pages). In some implementations, the volatile translation memory 230 can be a random access memory (RAM). The second stage 206 concatenates the five-bit line number 228 with the page address section 214 to generate a look-up address 232 for the volatile translation memory 230. The hit output 208 and a clock signal are fed into an AND gate 233 which triggers a read line 234 of the volatile translation memory 230.

When the volatile translation memory 230 is read, an eight-bit reallocated page address 236 is output from the volatile translation memory 230 into a decision element 238. The decision element 238 also inputs the hit output 208 and an eight-bit logical address section 240 containing the lower five bits of the block address section 212 plus the page address section 214. If the hit output 208 contains a positive value, the decision element 238 outputs the reallocated page address 236 into a reallocated page section 242 of the physical address 210. The reallocated page section 242, along with the offset address section 216 which is copied into a physical offset address section 244 of the physical address 210, comprises the full physical address 210 required to access the reallocated memory requested.

The physical address 210 is sized to contain the entire logical address 202 plus an additional upper bit 246. If the hit output 208 contains a negative value, the decision element outputs the logical address section 240. The remaining upper bits 250 of the block address section 212 (e.g., bits 15 through 18) are fed through to an upper address section 248 of the physical address 210. Thus, the entire logical address 202 is passed through to the physical address 210 within the initial clock cycle, along with the hit output 208 which populates the upper bit 246.

When the physical address 210 is read, for example, the upper bit 246 can be checked. If the upper bit 246 designates a miss, the logical address 202 can be immediately read from the physical address 210. If the upper bit 246 designates a hit, however, the reallocated location of the erasable object derived by the second stage 206 can be read from the physical address 210 at the next clock cycle.

Example Process For Managing Non-Volatile Memory

Figure 3:
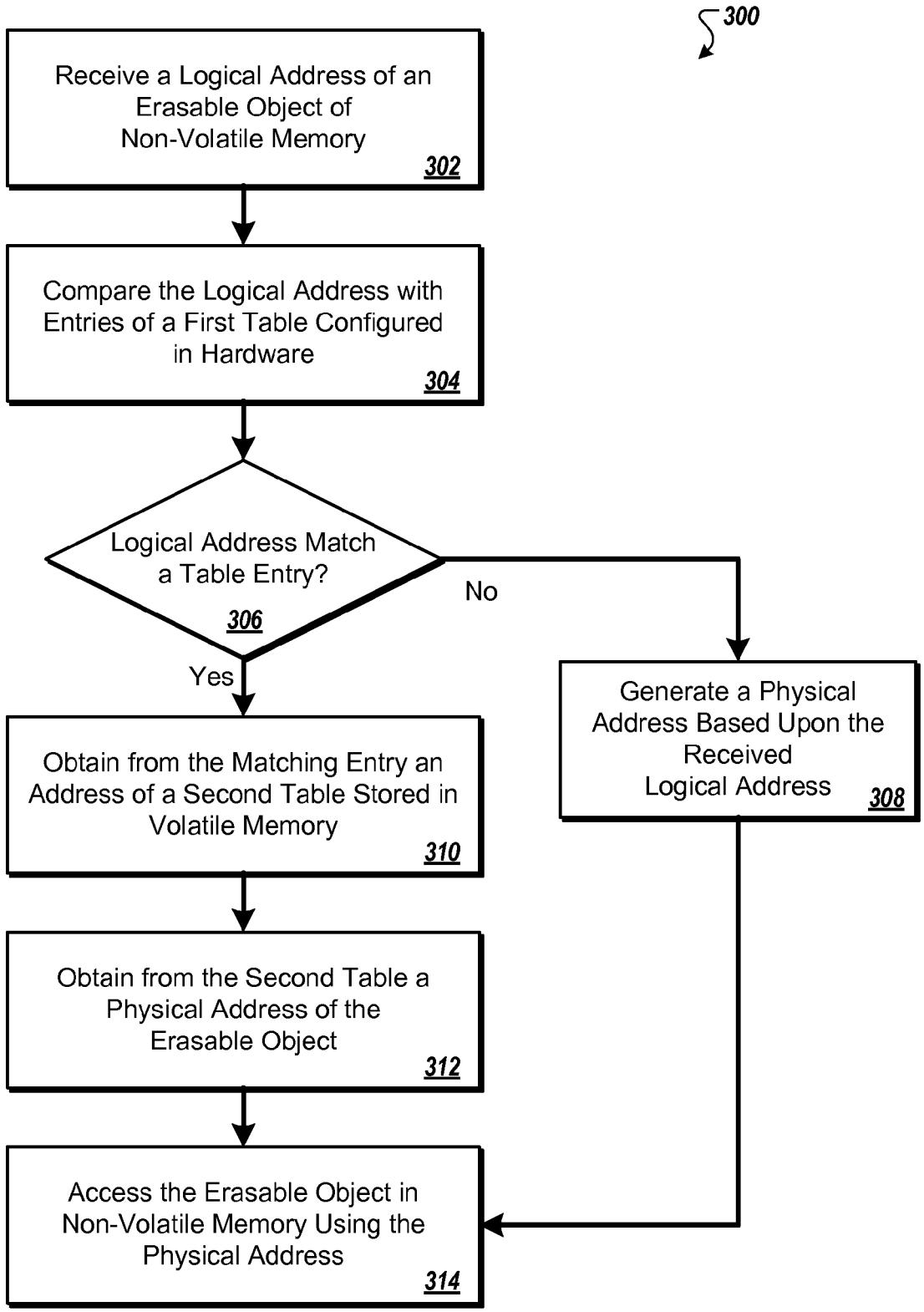
FIG. 3 is a flow diagram of an example process for managing non-volatile memory.

FIG. 3 is a flow diagram illustrating an example process 300 for managing non-volatile memory. The process 300, for example, could be executed upon the microcontroller 100 with the embedded non-volatile memory 104 (as shown in FIG. 1). In some implementations, the process 300 describes the functionality of a small content-addressable memory such as the CAM 200 (as described in FIG. 2).

The process 300 begins with receiving a logical address of an erasable object of non-volatile memory (302). For example, the logical address can be received from the CPU (e.g., the CPU 102). In some implementations, the erasable object refers to a discrete section of memory such as a block or page of non-volatile memory. For example, the logical address can include information for identifying a block and/or a particular page within a block plus an offset into the particular block and/or page of the block.

The logical address is compared with entries of a first table configured in hardware (304). The first table, in some examples, can be configured within non-volatile or volatile memory. The entries within the first table contain the logical addresses of erasable objects that have been reallocated in the non-volatile memory. Erasable objects, for example, can be reallocated due to a failure within the original memory location (e.g., a flash memory block reaches its erase limit). When an erasable object has been reallocated, for example, the erasable object can be moved to a non-user-addressable segment of the main non-volatile memory or to a location within a physically separate segment of non-volatile memory.

The first table, in some implementations, is an n×m fully associated table, where n is an integer representing a maximum number of blocks reallocated to a second segment (e.g., a non-user-addressable segment) of the non-volatile memory and m is an integer representing a maximum number of bits for encoding the logical addresses of all blocks stored in a first segment (e.g., a main segment) of the non-volatile memory. For example, a maximum number of n blocks of memory can be reallocated from the first segment of the non-volatile memory to the second segment of the non-volatile memory. In some implementations, the integer n is much smaller than the total number of blocks available within the first segment of the non-volatile memory. For example, only a small portion of the blocks within the first segment of the non-volatile memory can be reallocated to the second segment of the non-volatile memory. In other implementations, the integer n represents a majority of the blocks available within the first segment of the non-volatile memory.

In some implementations, the first table can contain additional information, such as data associated with each entry for determining if the entry stores a valid logical address of a reallocated erasable object. For example, within the first stage 204 as described in FIG. 2, each line 218 contains a verification bit 222. In some implementations, only a portion of the logical address is compared with the entries of the first table. For example, within the CAM 200, the block portion 212 of the logical address 202 is compared with each line 218 of the first stage 204.

If the logical address does not match a table entry (306), the memory location referred to by the logical address has not been reallocated. The memory location can be accessed based upon the received logical address. A physical address is generated based upon the received logical address (308). In some implementations, the physical address is equivalent to the received logical address. In other implementations, the logical address is a virtual address which can be mapped to a physical address (e.g., through a Memory Management Unit (MMU)).

If the logical address does match a table entry (306), the memory location referred to by the logical address has been reallocated. The process 300 can now locate the new address of the requested information. An address of a second table stored in volatile memory is obtained from the matching table entry (310). The second table stores the physical addresses of erasable objects that have been reallocated in the non-volatile memory. In some implementations, the results of the comparison done within the first table are encoded and combined with a portion of the received logical address to generate a look-up address for the second table. For example, within the CAM 200, the five-bit line number 228 of the matching table entry is concatenated with the page address section 214 of the logical address 202 to generate a look-up address 232 for the volatile translation memory 230. In some implementations, the second table is an 8*nxp table, in which n is the integer representing the maximum number of blocks reallocated to the second segment of non-volatile memory and p is an integer representing the number of pages within each block of memory. For example, each entry within the second table can contain the physical address of a page containing a reallocated erasable object. In other implementations, the second table can contain entries associated with blocks of reallocated erasable objects.

A physical address of the erasable object is obtained from the second table (312). Using the look-up address, for example, the volatile translation memory 230 is read to obtain the physical address. In some implementations, the information read from the second table is concatenated with other information to form the physical address. For example, the output of the volatile translation memory 230 is combined with the offset section 216 of the logical address 202 to generate the physical address 210. In other implementations, the second table contains the complete physical address.

The erasable object is accessed in non-volatile memory using the physical address (314). For example, if the erasable object was reallocated, the physical address can be transferred from the volatile data memory 106 to the non-volatile program data memory 104 through the bus controller 108. If the erasable object was not reallocated, the non-volatile program data memory 104 can be read using the physical address generated based upon the logical address. The information written at the physical address can then be accessed within the non-volatile program data memory 104 and sent to the requester (e.g., the CPU 102) via the program bus 112.

In some implementations, more or fewer steps can be included within the process 300 or the steps of the process 300 can be executed within a different order. For example, in some implementations, the contents of a recently accessed location can be cached for quick look-up. Other implementations are possible.

While this document contains many specific implementation details, these should not be construed as limitations on the scope what may be claimed, but rather as descriptions of features that may be specific to particular embodiments. For example, the sizes of the segments of non-volatile memory within the CAM 200 of FIG. 2 are for exemplary purposes only and are not indicative of a recommended size ratio or range for designing a small content-addressable memory for managing a non-volatile memory. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

A number of implementations have been described. Nevertheless, it will be understood that various modifications may be made. For example, steps of one or more processes may be combined, deleted, modified, or supplemented to form further processes. As yet another example, the process steps depicted in the figures do not require the particular order shown to achieve desirable results. In addition, other steps may be provided, or steps may be eliminated, from the described processes, and other materials may be added to, or removed from, the described processes. Accordingly, other implementations are within the scope of the following claims.

What is claimed is:

1. A method of managing non-volatile memory, comprising:
   receiving a logical address of an erasable object of non-volatile memory;
   comparing the logical address with entries of a first table, the entries containing logical addresses of erasable objects that have been reallocated in the non-volatile memory, where each entry is associated with a line number;
   if the received logical address does not match an entry of the first table,
      generating a physical address for the erasable object from the received logical address;
   if the received logical address matches an entry of the first table,
      encoding the line number of the matching line to obtain an encoded line number, concatenating the encoded line number with a portion of the received logical address to obtain an address of a second table storing physical addresses of erasable objects that have been reallocated in the non-volatile memory;
      using the address of the second table and the received logical address to obtain from the second table the physical address of the erasable object; and
   using the physical address to access the erasable object from non-volatile memory.

2. The method of claim 1, where the erasable object is a block and the logical address includes a first portion for identifying the block, a second portion for identifying pages in the block, and third portion for providing an offset into a page of the block.

3. The method of claim 1, where the first table is an n×m fully associated table containing logical addresses for reallocated blocks, where n is an integer representing a maximum number of reallocated blocks in a first segment of the non-volatile memory storing the reallocated blocks and m is an integer representing a maximum number of bits for encoding the logical addresses of unallocated blocks stored in a second segment of the non-volatile memory.

4. The method of claim 1, where an entry of the first table includes data for determining if the entry stores a valid logical address of a reallocated erasable object.

5. The method of claim 1, where the first table is configured in hardware registers and the second table is configured in volatile memory.

6. A system for managing non-volatile memory, comprising:
    non-volatile memory; and
    a processor coupled to the non-volatile memory and operable for: receiving a logical address of an erasable object of non-volatile memory; comparing the logical address with entries of a first table, the entries containing logical addresses of erasable objects that have been reallocated in the non-volatile memory, where each entry is associated with a line number; if the received logical address does not match an entry of the first table, generating a physical address for the erasable object from the received logical address; if the received logical address matches an entry of the first table, encoding the line number of the matching entry to obtain an encoded line number, concatenating the encoded line number with a portion of the received logical address to obtain an address of a second table storing physical addresses of erasable objects that have been reallocated in the non-volatile memory using the address of the second table and the received logical address to obtain from the second table the physical address of the erasable object; and using the physical address to access the erasable object from non-volatile memory.

7. The system of claim 6, where the erasable object is a block and the logical address includes a first portion for identifying the block, a second portion for identifying pages in the block, and third portion for providing an offset into a page of the block.

8. The system of claim 6, where the first table is an n×m fully associated table containing logical addresses for reallocated blocks, where n is an integer representing a maximum number of reallocated blocks in a first segment of the non-volatile memory storing the reallocated blocks and m is an integer representing a maximum number of bits for encoding the logical addresses of unallocated blocks stored in a second segment of the non-volatile memory.

9. The system of claim 6, where an entry of the first table includes data for determining if the entry stores a valid logical address of a reallocated erasable object.

10. The system of claim 6, where the first table is configured in hardware registers and the second table is configured in volatile memory.

* * * * *